US007414913B1

(12) United States Patent
Fenstermaker et al.

(10) Patent No.: US 7,414,913 B1
(45) Date of Patent: Aug. 19, 2008

(54) BITLINE TWISTING SCHEME FOR MULTIPORT MEMORY

(75) Inventors: Larry Fenstermaker, Nazareth, PA (US); Harold N. Scholz, Allentown, PA (US); Gregory Cartney, Coplay, PA (US); Allen White, Austin, TX (US); Margaret Tait, Austin, TX (US); Hemanshu T. Vernenker, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 29 days.

(21) Appl. No.: 11/194,871

(22) Filed: Aug. 1, 2005

(51) Int. Cl.
*G11C 8/00* (2006.01)

(52) U.S. Cl. .................. 365/230.05; 365/69; 365/154

(58) Field of Classification Search ............ 365/230.05, 365/69, 154, 63, 214, 189.09, 185.23
See application file for complete search history.

(56) References Cited

U.S. PATENT DOCUMENTS

| | | | | |
|---|---|---|---|---|
| 5,287,322 A | * | 2/1994 | Rastegar | 365/230.05 |
| 5,818,786 A | * | 10/1998 | Yoneda | 365/230.03 |
| 6,084,820 A | | 7/2000 | Raszka | 365/230.05 |
| 6,370,078 B1 | * | 4/2002 | Wik et al. | 365/230.05 |
| 6,445,638 B1 | * | 9/2002 | Hsu et al. | 365/230.05 |
| 6,498,758 B1 | | 12/2002 | Pomar et al. | 365/214 |
| 6,665,204 B2 | * | 12/2003 | Takeda | 365/63 |

OTHER PUBLICATIONS

U.S. Appl. No. 10/671,756, filed Sep. 26, 2003.

* cited by examiner

*Primary Examiner*—Dang T Nguyen
(74) *Attorney, Agent, or Firm*—Mendelsohn & Associate; Steve Mendelsohn

(57) ABSTRACT

A multiport memory in one embodiment of the invention includes a memory cell array, where each column in the array has two exterior complementary bitline pairs and zero, one, or more interior complementary bitline pairs. Across each pair of adjacent columns in the array, the adjacent exterior bitline pairs are associated with the same port in the multiport memory. In addition, within each column, the two exterior bitline pairs have the same, non-zero number of crossovers, and, across each pair of adjacent columns, the exterior bitline pairs have different numbers of crossovers. Furthermore, each column has at least one reference signal line located between the two exterior bitline pairs.

23 Claims, 1 Drawing Sheet

BITLINE TWISTING SCHEME FOR MULTIPORT MEMORY

CROSS-REFERENCE TO RELATED APPLICATIONS

The subject matter of this application is related to U.S. patent application Ser. No. 10/671,756 filed Sep. 26, 2003, the teachings of which are incorporated herein by reference.

TECHNICAL FIELD

The present invention relates to memory devices.

BACKGROUND

Conventional memory devices store data bits in individually addressable memory cells arranged in rows and columns as a memory cell array. Read/write voltages are applied to individual memory cells using row and column electrodes referred to as word lines and bitlines, respectively. Associated with each port in the memory device, a typical memory cell array has one word line for each row of memory cells and one pair of complementary bitlines for each column of memory cells. Thus, a single-port memory would have a single word line associated with each row and a single pair of complementary bitlines associated with each column, while a dual-port memory would have two word lines associated with each row and two pairs of complementary bitlines associated with each column, and so on.

In order to obtain high memory density, memory cells are defined using small circuit areas. As a result, read/write signals propagating on one bitline can be coupled to one or more adjacent bitlines. Such coupling can be associated with inaccurate read/write operations, or can cause data loss in a memory cell. In particular, a write operation on a bitline is a relatively "strong" operation, driven directly by a strong buffer or single transistor. A bitline read operation, on the other hand, is relatively "weak," driven through small, weak, access transistors of the memory cells. When a bitline being used for a write operation couples to a bitline used for a read operation, the read operation is almost always adversely affected such that the read operation may fail. While adjacent bitlines can be shielded using parallel electrodes that are connected to a supply voltage or ground, relying exclusively on such electrodes is undesirable in many applications because they occupy an appreciable amount of available circuit area.

SUMMARY

In one embodiment, the present invention is an integrated circuit having a multiport memory comprising an array of memory cells arranged in rows and columns. Each column in the array comprises two exterior complementary bitline pairs and zero, one, or more interior complementary bitline pairs. Across at least two adjacent columns in the array, the adjacent exterior bitline pairs are associated with the same port in the multiport memory.

BRIEF DESCRIPTION OF THE DRAWINGS

Other aspects, features, and advantages of the present invention will become more fully apparent from the following detailed description, the appended claims, and the accompanying drawing.

DETAILED DESCRIPTION

Figure 1:
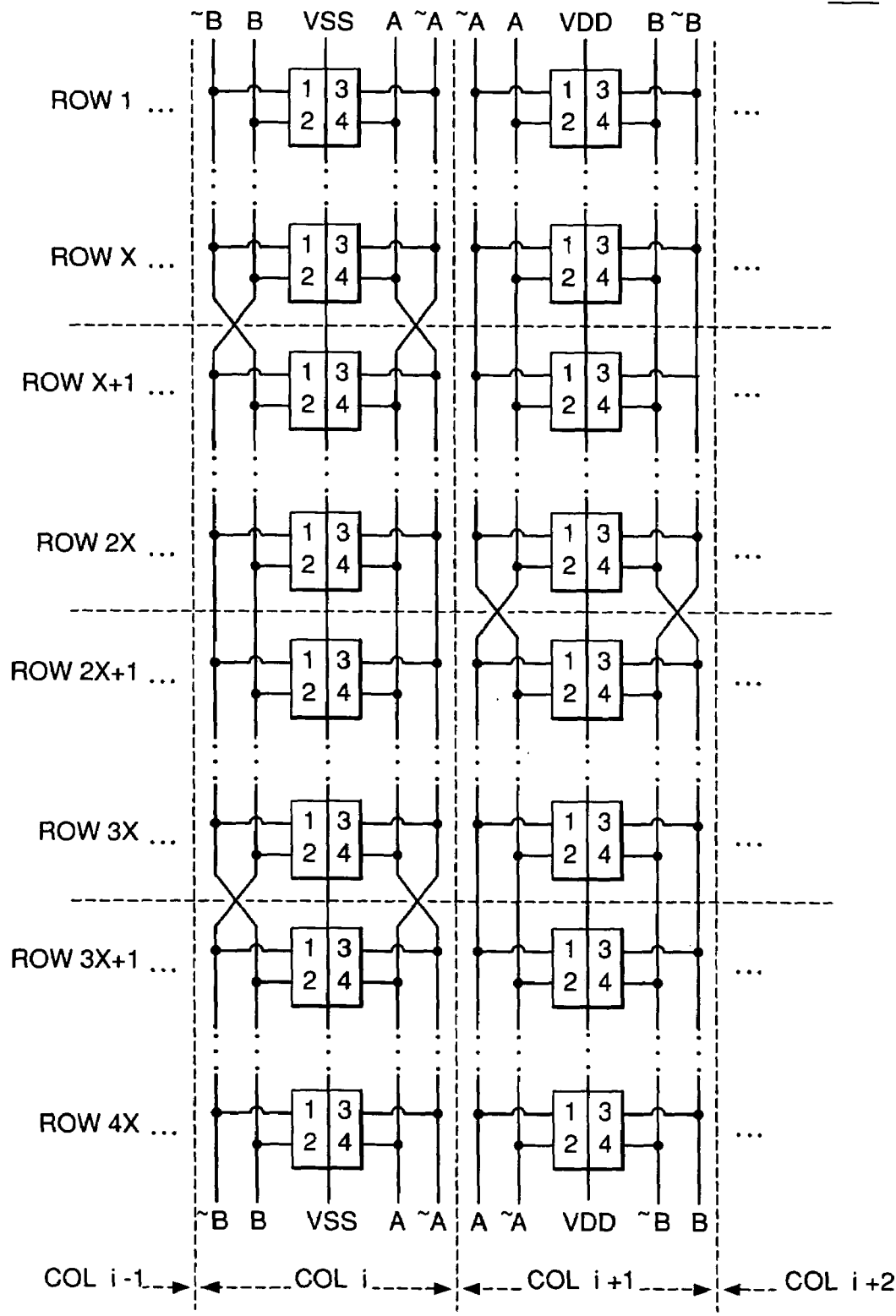
FIG. 1 is a schematic diagram of a portion of a dual-port SRAM, according to one embodiment of the present invention.

For convenience, memories that include a plurality of memory cells or bitcells are described with reference to bitlines that are configured to apply electrical signals to the bitcells to store or "write" logical values to the bitcells. These logical values typically correspond to predetermined voltages that are assigned to logical values. Obtaining stored logical values (i.e., "reading" the bitcells) can be performed using the same bitlines. A pair of bitlines is typically provided for each memory port and is configured to communicate a logical value and a complement of the logical value to a memory cell. For convenience, a bitline configured to communicate a complementary value is referred to herein as a complementary bitline. An embodiment of the present invention is described with reference to static random access memory (SRAM), but, in other embodiments, dynamic access random access memory (DRAM) or other types of memory arrays can be similarly configured.

FIG. 1 is a schematic diagram of a portion of the memory cell array of a dual-port SRAM 100 (having ports A and B (not shown)), according to one embodiment of the present invention. Dual-port SRAM 100 has 4X rows of memory cells and an unspecified number (typically, although not necessarily, an integer power of two) of columns, each column having 4X memory cells, where $X \geq 1$. In this particular embodiment, the memory cell array is divided into four equal-sized regions, each having X rows of memory cells.

Only two representative adjacent columns (i.e., columns i and i+1) are shown in FIG. 1. The configuration of each other pair of adjacent columns in SRAM 100 is identical to that of columns i and i+1. For example, column i+2 has the same configuration as column i, and column i+3 has the same configuration as column i+1. Similarly, column i−1 has the same configuration as column i+1, and column i−2 has the same configuration as column i. In general, assuming that the left-most column in SRAM 100 is referred to as "column 1," each odd-numbered column has the configuration of column i, and each even-numbered column has the configuration of column i+1. Note that, for simplicity, the word lines in SRAM 100 are not depicted in FIG. 1. Also not depicted are the various column and row circuits (e.g., drivers, sense amps) that support the data writing and reading functions of SRAM 100.

As shown in FIG. 1, each column has a first pair of complementary bitlines A and ~A (i.e., A-complement) associated with memory port A, and a second pair of complementary bitlines B and ~B (i.e., B-complement) associated with memory port B, where the lateral (e.g., left-to-right) sequence of bitlines is different between column i and column i+1. In particular, at the top of column i, the left-to-right bitline sequence is (~B, B, A, ~A), while, at the top of column i+1, the left-to-right bitline sequence is the reverse (~A, A, B, ~B).

As a result of these different left-to-right bitline sequences between columns i and i+1, the bitlines associated with memory port A (i.e., the A bitline pair) in column i is adjacent to the A bitline pair in column i+1. Similarly, the B bitline pair in column i is adjacent to the B bitline pair in column i−1, and the B bitline pair in column i+1 is adjacent to the B bitline pair in column i+2. In general, the adjacent bitlines between each pair of adjacent columns correspond to the same memory port.

Another difference between the configurations of columns i and i+1 is that reference signal line VSS runs through the middle of column i, while reference signal line VDD runs through the middle of column i+1.

Yet another difference between the configurations of columns i and i+1 relates to the existence of different crossover schemes within the columns. In particular, in column i, each bitline pair has one crossover between rows X and X+1 and another crossover between rows 3X and 3X+1. In column i+1, on the other hand, each bitline pair has a single crossover between rows 2X and 2X+1.

Bitline crossovers (a.k.a., bitline exchanges) can be implemented using two or more conductor layers in the memory. For example, bitlines A and ~A can be defined in a first conductor layer, and bitline exchanges can be accomplished by routing one of the bitlines to a second conductor layer situated either over or under the first conductor layer. After such routing, the bitline that is routed to the second layer can be rerouted to the first layer. Alternatively, bitlines A and ~A can be defined in separate conductor layers, so that bitline exchanges do not require routing a bitline from one conductor layer to another.

Since column i has an even number of crossovers for each bitline pair, the bitline sequence at the bottom of column i is the same as that at the top. On the other hand, since column i+1 has an odd number of crossovers for each bitline pair, the bitline sequence at the bottom of column i+1 (i.e., A, ~A, ~B, B) is different from that at the top. Note further that, in column i, the bitline sequence for row X+1 to row 3X (i.e., B, ~B, ~A, A) is different from that at the top and bottom of that column.

The bitline sequences, reference signal line positions, and crossover schemes employed in the configurations of columns i and i+1 tend to reduce crosstalk between different pairs of complementary bitlines in SRAM 100.

In particular, each reference signal line (i.e., VSS and VDD) provides some degree of electrical shielding between the A bitline pair and the B bitline pair within the corresponding column.

In addition, the different crossover schemes in columns i and i+1 tend to negate induced crosstalk signals between columns. For example, between row 1 and row X, bitline ~A of column i and bitline ~A of column i+1 are the closest bitlines between the two columns. Due to the crossover in column i between rows X and X+1, the closest bitlines between the two columns between row X+1 and row 2X are bitline A of column i and bitline ~A of column i+1. Due to the crossover in column i+1 between rows 2X and 2X+1, the closest bitlines between the two columns between row 2X+1 and row 3X are bitline A of column i and bitline A of column i+1. And, lastly, due to the crossover in column i between rows 3X and 3X+1, the closest bitlines between the two columns between row 3X+1 and row 4X are bitline ~A of column i and bitline A of column i+1. While there may still be crosstalk signals induced between adjacent sections of signal lines, the crossover scheme is designed such that those crosstalk signals will at least partially and possibly even completely cancel each other out over the entire height of each column. Note that similar crosstalk cancellation will occur between the B bitlines of column i and column i−1 and between the B bitlines of column i+1 and column i+2.

Although bitline crossover schemes can reduce the effects of crosstalk, such schemes alone might not eliminate those effects. Moreover, in some cases, bitline crossovers can significantly reduce the voltages on bitlines during read operations, such that a sense amp failure may occur.

The different bitline sequences of columns i and i+1 result in adjacent bitline pairs between columns being associated with the same port. For example, the A bitline pair of column i is adjacent to the A bitline pair of column i+1. Similarly, the B bitline pairs of columns i+1 and i+2 will be adjacent, as will the B bitline pairs of columns i and i−1.

This configuration tends to preclude a "read disturb" situation, where a "write" operation implemented using one port disturbs a simultaneous "read" operation implemented using another other port. In particular, if the top of each column had the same left-to-right bitline sequence of, for example, column i, such that the A bitline pair of column i were adjacent the B bitline pair of column i+1, then performing a write operation using port A (or B) could disturb a simultaneous read operation using port B (or A). The different bitline sequences between columns i and i+1 in this embodiment of the present invention eliminates the chances of such disturbances by guaranteeing that only similar operations (e.g., either read or write) can simultaneously occur on any adjacent bitlines between columns. Additionally, the adverse effects of crosstalk are eliminated because crosstalk between bitlines that are performing the same operation (e.g., either a read or a write) are not destructive to each other.

As indicated in FIG. 1, each memory cell has four bitline inputs, labeled 1-4 in FIG. 1 and referred to in this text as BLI1-BLI4. In one implementation of SRAM 100, the same layout design is used for each memory cell in FIG. 1. As such, the bitline crossovers cause different memory cells to be connected differently to the various bitlines (i.e., different bitline connection schemes). In particular, as a result of the four crossovers in column i:

For memory cells in rows 1 to X and in rows 3X+1 to 4X:
Bitline ~B is connected to BLI1 (i.e., bitline input 1);
Bitline B is connected to BLI2;
Bitline ~A is connected to BLI3; and
Bitline A is connected to BLI4; and For memory cells in rows X+1 to 3X:
Bitline B is connected to BLI1;
Bitline ~B is connected to BLI2;
Bitline A is connected to BLI3; and
Bitline ~A is connected to BLI4.

Similarly, as a result of the two crossovers in column i+1:
For memory cells in rows 1 to 2X:
Bitline ~A is connected to BLI1;
Bitline A is connected to BLI2;
Bitline ~B is connected to BLI3; and
Bitline B is connected to BLI4; and For memory cells in rows 2X+1 to 4X:
Bitline A is connected to BLI1;
Bitline ~A is connected to BLI2;
Bitline B is connected to BLI3; and
Bitline ~B is connected to BLI4.

These different bitline connection schemes result in data being stored differently. In particular, the same logical signal (e.g., a logical 0) stored in a memory cell of any of rows 1 to X or rows 3X+1 to 4X of column i would be stored in an inverted manner (e.g., as a logical 1) in a memory cell of any of rows X+1 to 3X of that column. Similarly, the same logical signal stored in a memory cell of any of rows 1 to 2X of column i+1 would be stored in an inverted manner in a memory cell of any of rows 2X+1 to 4X of that column. Nevertheless, since, due to the crossover scheme, such logical inversion is repeated when data is read from such a memory cell, no net adverse effects result from this situation. For example, a logical 0 stored in an "inverting" memory cell as a logical 1 would be "re-inverted" when read out from that memory cell as a logical 0. Moreover, because the same crossover scheme is employed for both pairs of complementary signals within each column, data written using memory port A can be safely read using memory port B, and vice versa. In alternative implementations, a different (i.e., appropriately designed) cell layout can be employed for each different bitline connection scheme, in order to avoid this logical inversion phenomenon.

Although the example of FIG. 1 shows reference signal VSS traversing column i and reference signal VDD traversing column i+1, the sequence and/or types of reference signals applied to those conducting lines can differ in alternative embodiments of the present invention.

In the particular example of FIG. 1 and as indicated in FIG. 1 by broken horizontal lines, the crossover schemes of columns i and i+1 effectively divide the memory cell array into four regions each having the same number of rows (i.e., X), where the crossovers are located between rows. The invention is not necessarily so limited. For example, crossovers can be located at or within rows, rather than between rows. Moreover, the crossovers do not necessarily have to divide the memory cell array into equal-sized regions having the same numbers of rows.

Furthermore, while the example of FIG. 1 has one crossover per bitline pair in column i and two crossovers per bitline pair in column i+1, alternative embodiments could have other numbers of crossovers per bitline pair. For example, column i+1 could have three crossovers per bitline pair (e.g., dividing column i+1 into four equal-sized regions), and column i could have four crossovers per bitline (e.g., corresponding to the midpoints of each of the four regions of column i+1).

In addition, while the example of FIG. 1 is for a dual-port memory, the present invention can be extended to memories having more than two ports. For example, the following represents the left-to-right bitline sequence at the top of three adjacent columns of a memory cell array for a possible three-port memory:

A1~A1|B1~B1|C1~C1~C2    C2|~B2    B2|~A2    A2 A3~A3|B3~B3|C3~C3 where "|" represents a reference signal line (e.g., VSS or VDD) within a column. Note that, in this example, the adjacent bitline pairs between columns 1 and 2 are both associated with memory port C, and the adjacent bitline pairs between columns 2 and 3 are both associated with memory port A. Note further that, in this example, the left-to-right port sequence is inverted between adjacent columns (i.e., ABC for column 1, CBA for column 2, and ABC again for column 3).

The following represents the left-to-right bitline sequence at the top of three adjacent columns of a memory cell array for a different three-port memory:

A1~A1|B1~B1|C1~C1~C2    C2|A2~A2|B2~B2~B3 B3|C3~C3|A3~A3

In this example, the adjacent bitline pairs between columns 1 and 2 are both associated with memory port C, and the adjacent bitline pairs between columns 2 and 3 are both associated with memory port B. Note further that, in this example, the left-to-right port sequence is not simply inverted between adjacent columns (i.e., ABC for column 1, CAB for column 2, and BCA for column 3), where the interior bitline pair alternates between ports across columns (i.e., B for column 1, A for column 2, and C for column 3).

For such memories having three (or more) ports, since interior bitline pairs are shielded on both sides by reference signal lines, they can be implemented without any crossovers, while the two exterior bitline pairs within each column (e.g., the A and C bitline pairs in column 1 of both previous examples) would have the same number of crossovers.

It will be further understood that various changes in the details, materials, and arrangements of the parts which have been described and illustrated in order to explain the nature of this invention may be made by those skilled in the art without departing from the scope of the invention as expressed in the following claims.

We claim:

1. An integrated circuit having a multiport memory comprising an array of memory cells arranged in rows and columns, wherein:
   each column in the array comprises two exterior complementary bitline pairs and zero, one, or more interior complementary bitline pairs;
   each of two sides of each column has an exterior complementary bitline pair associated with a single port in the multiport memory;
   the two exterior complementary bitline pairs of each column are associated with two different ports in the multiport memory;
   across at least two adjacent columns in the array, the adjacent exterior bitline pairs are associated with the same port in the multiport memory;
   a first of the two adjacent columns has a first lateral bitline sequence; and
   a second of the two adjacent columns has a second lateral bitline sequence different from the first lateral bitline sequence.

2. The invention of claim 1, wherein, across each pair of adjacent columns in the array, the adjacent exterior bitline pairs are associated with the same port in the multiport memory.

3. The invention of claim 1, wherein, within each column of the two adjacent columns, the two exterior bitline pairs have the same, non-zero number of crossovers.

4. The invention of claim 3, wherein, across the two adjacent columns, the exterior bitline pairs have different numbers of crossovers.

5. The invention of claim 4, wherein:
   within a first of the two adjacent columns, each exterior bitline pair has exactly one crossover; and
   within a second of the two adjacent columns, each exterior bitline pair has exactly two crossovers.

6. The invention of claim 5, wherein the vertical location of the one crossover per bitline pair in the first column is different from the vertical locations of the two crossovers per bitline pair in the second column.

7. The invention of claim 6, wherein:
   the one crossover per bitline pair in the first column is located at about the midpoint of the first column; and
   the two crossovers per bitline pair in the second column are displaced from the top and bottom of the second column by about one quarter of the height of the second column.

8. The invention of claim 3, wherein:
   within each column in the array, the two exterior bitline pairs have the same, non-zero number of crossovers; and
   across each pair of adjacent columns in the array, the exterior bitline pairs have different numbers of crossovers.

9. The invention of claim 3, wherein each column in the array has at least one interior bitline pair with no crossovers.

10. The invention of claim 3, wherein, within each of the two adjacent columns, the crossovers in the two exterior bitline pairs have substantially the same vertical locations.

11. The invention of claim 1, wherein each column in the array has at least one reference signal line located between the two exterior bitline pairs.

12. The invention of claim 11, wherein each column in the array has at least one interior bitline pair and a reference signal line located on each side of the at least one interior bitline pair.

13. The invention of claim 1, wherein each memory cell in the array has the same layout design.

14. The invention of claim 1, wherein, at the tops of the two adjacent columns, the first lateral bitline sequence is the reverse of the second lateral bitline sequence.

15. The invention of claim 1, wherein there are no reference signal lines located between any pair of adjacent columns in the array.

16. The invention of claim 1, wherein:
across each pair of adjacent columns in the array, the adjacent exterior bitline pairs are associated with the same port in the multiport memory;
within each column in the array, the two exterior bitline pairs have the same, non-zero number of crossovers;
across each pair of adjacent columns in the array, the exterior bitline pairs have different numbers of crossovers;
each column in the array has at least one reference signal line located between the two exterior bitline pairs;
within each column in the array, the crossovers in the two exterior bitline pairs have substantially the same vertical locations;
each memory cell in the array has the same layout design; and
there are no reference signal lines located between any pair of adjacent columns in the array.

17. The invention of claim 16, wherein:
within a first column of each pair of adjacent columns in the array, each exterior bitline pair has exactly one crossover;
within a second column of each pair of adjacent columns in the array, each exterior bitline pair has exactly two crossovers;
the one crossover per bitline pair in the first column is located at about the midpoint of the first column; and
the two crossovers per bitline pair in the second column are displaced from the top and bottom of the second column by about one quarter of the height of the second column.

18. The invention of claim 16, wherein each column in the array has at least one interior bitline pair with no crossovers and a reference signal line located on each side of the at least one interior bitline pair.

19. An integrated circuit having a multiport memory comprising an array of memory cells arranged in rows and columns, wherein:
each column in the array comprises two exterior complementary bitline pairs and zero, one, or more interior complementary bitline pairs;
each of two sides of each column has an exterior complementary bitline pair associated with a single port in the multiport memory;
the two exterior complementary bitline pairs of each column are associated with two different ports in the multiport memory;
across at least two adjacent columns in the array, the adjacent exterior bitline pairs are associated with the same port in the multiport memory;
within each column of the two adjacent columns, the two exterior bitline pairs have the same, non-zero number of crossovers; and
across the two adjacent columns, the exterior bitline pairs have different numbers of crossovers.

20. An integrated circuit having a multiport memory comprising an array of memory cells arranged in rows and columns, wherein:
each column in the array comprises two exterior complementary bitline pairs and zero, one, or more interior complementary bitline pairs;
each of two sides of each column has an exterior complementary bitline pair associated with a single port in the multiport memory;
the two exterior complementary bitline pairs of each column are associated with two different ports in the multiport memory;
across at least two adjacent columns in the array, the adjacent exterior bitline pairs are associated with the same port in the multiport memory;
within each column of the two adjacent columns, the two exterior bitline pairs have the same, non-zero number of crossovers; and
each column in the array has at least one interior bitline pair with no crossovers.

21. An integrated circuit having a multiport memory comprising an array of memory cells arranged in rows and columns, wherein:
each column in the array comprises two exterior complementary bitline pairs and zero, one, or more interior complementary bitline pairs; and
across at least two adjacent columns in the array, the adjacent exterior bitline pairs are associated with the same port in the multiport memory, wherein each column in the array has at least one reference signal line located between the two exterior bitline pairs.

22. An integrated circuit having a multiport memory comprising an array of memory cells arranged in rows and columns, wherein:
each column in the array comprises two exterior complementary bitline pairs and zero, one, or more interior complementary bitline pairs;
each of two sides of each column has an exterior complementary bitline pair associated with a single port in the multiport memory;
the two exterior complementary bitline pairs of each column are associated with two different ports in the multiport memory; and
across at least two adjacent columns in the array, the adjacent exterior bitline pairs are associated with the same port in the multiport memory, wherein there are no reference signal lines located between any pair of adjacent columns in the array.

23. The invention of claim 21, wherein:
each of two sides of each column has an exterior complementary bitline pair associated with a single port in the multiport memory; and
the two exterior complementary bitline pairs of each column are associated with two different ports in the multiport memory.

* * * * *